(12) United States Patent
Urashima

(10) Patent No.: US 7,935,955 B2
(45) Date of Patent: May 3, 2011

(54) GROUP III NITRIDE SEMICONDUCTOR MULTILAYER STRUCTURE

(75) Inventor: Yasuhito Urashima, Chiba (JP)

(73) Assignee: Showa Denko K.K., Tokyo (JP)

( * ) Notice: Subject to any disclaimer, the term of this patent is extended or adjusted under 35 U.S.C. 154(b) by 655 days.

(21) Appl. No.: 10/586,543

(22) PCT Filed: Jan. 25, 2005

(86) PCT No.: PCT/JP2005/001294
§ 371 (c)(1),
(2), (4) Date: Jul. 19, 2006

(87) PCT Pub. No.: WO2005/071720
PCT Pub. Date: Aug. 4, 2005

(65) Prior Publication Data
US 2008/0230780 A1    Sep. 25, 2008

Related U.S. Application Data

(60) Provisional application No. 60/541,071, filed on Feb. 3, 2004.

(30) Foreign Application Priority Data

Jan. 26, 2004  (JP) .................................. 2004-017368

(51) Int. Cl.
*H01L 29/04* (2006.01)
*H01L 29/06* (2006.01)
*H01L 31/102* (2006.01)
(52) U.S. Cl. ...... 257/11; 257/51; 257/189; 257/E21.108
(58) Field of Classification Search ............... 257/11, 257/189, 615, E33.023, E33.049, E31.019, 257/51, E21.108
See application file for complete search history.

(56) References Cited

U.S. PATENT DOCUMENTS 6,232,623 B1  5/2001 Morita
6,864,158 B2 * 3/2005 Ishida .......................... 438/479
(Continued)

FOREIGN PATENT DOCUMENTS

CN       1395320 A       2/2003
(Continued)

OTHER PUBLICATIONS

Takahiro Ito, et al.; "Influence of Thermal Annealing on GaN Buffer Layers and the Property of Subsequent GaN Layers Grown by Metalorganic Chemical Vapor Deposition"; Jpn. J. Appl. Phys., Part 1, vol. 38, No. 2A; Feb. 1999; pp. 649-653; XP-002616994.

(Continued)

Primary Examiner — Evan Pert
Assistant Examiner — Selim Ahmed
(74) Attorney, Agent, or Firm — Sughrue Mion, PLLC

(57) ABSTRACT

An object of the present invention is to provide a Group III nitride semiconductor multilayer structure having a smooth surface and exhibiting excellent crystallinity, which multilayer structure employs a low-cost substrate that can be easily processed. Another object is to provide a Group III nitride semiconductor light-emitting device comprising the multilayer structure.
The inventive Group III nitride semiconductor multilayer structure comprises a substrate; an $Al_xGa_{1-x}N$ ($0 \leq x \leq 1$) buffer layer which is provided on the substrate and has a columnar or island-like crystal structure; and an $Al_xIn_yGa_{1-x-y}N$ ($0 \leq x \leq 1$, $0 \leq y \leq 1$, $0 \leq x+y \leq 1$) single-crystal layer provided on the buffer layer, wherein the substrate has, on its surface, non-periodically distributed grooves having an average depth of 0.01 to 5 μm.

12 Claims, 7 Drawing Sheets

U.S. PATENT DOCUMENTS

| | | | |
|---|---|---|---|
| 6,917,059 B2 * | 7/2005 | Uemura | 257/103 |
| 2001/0010941 A1 * | 8/2001 | Morita | 438/46 |
| 2002/0078881 A1 * | 6/2002 | Cuomo et al. | 117/84 |
| 2002/0170489 A1 | 11/2002 | Biwa et al. | |
| 2003/0207125 A1 * | 11/2003 | Sunakawa et al. | 428/428 |

FOREIGN PATENT DOCUMENTS

| | | |
|---|---|---|
| JP | 10-125608 A | 5/1998 |
| JP | 2000-21772 A | 1/2000 |
| JP | 2000-319099 A | 11/2000 |
| JP | 2002-93726 | 3/2002 |
| JP | 2002-313733 A | 10/2002 |
| JP | 2003-243302 | 8/2003 |

OTHER PUBLICATIONS

Shigekazu Sano, et al.; Low-dislocation-density GaN and $Gi_xGa_{1-x}N$ ($x \leqq 0.13$) grown on grooved substrates; Journal of Crystal Growth; vol. 234, No. 1-4; Feb. 1, 2002; pp. 129-134; XP 004333449.

A. Kakanakova-Georgieva, et al.; "Epitaxial Growth of AlN Layers on SiC Substrates in a Hot-Wall MOCVD System"; phys. stat. sol. (c) vol. 0; No. 1; 2002; pp. 205-208; XP-002616996.

J.A. Powell, et al.; "Process-Induced Morphological Defects in Epitaxial CVD Silicon Carbide"; phys. stat. sol. (b); vol. 202, No. 1; Jul. 1, 1997; pp. 529-548; XP-002616995.

* cited by examiner

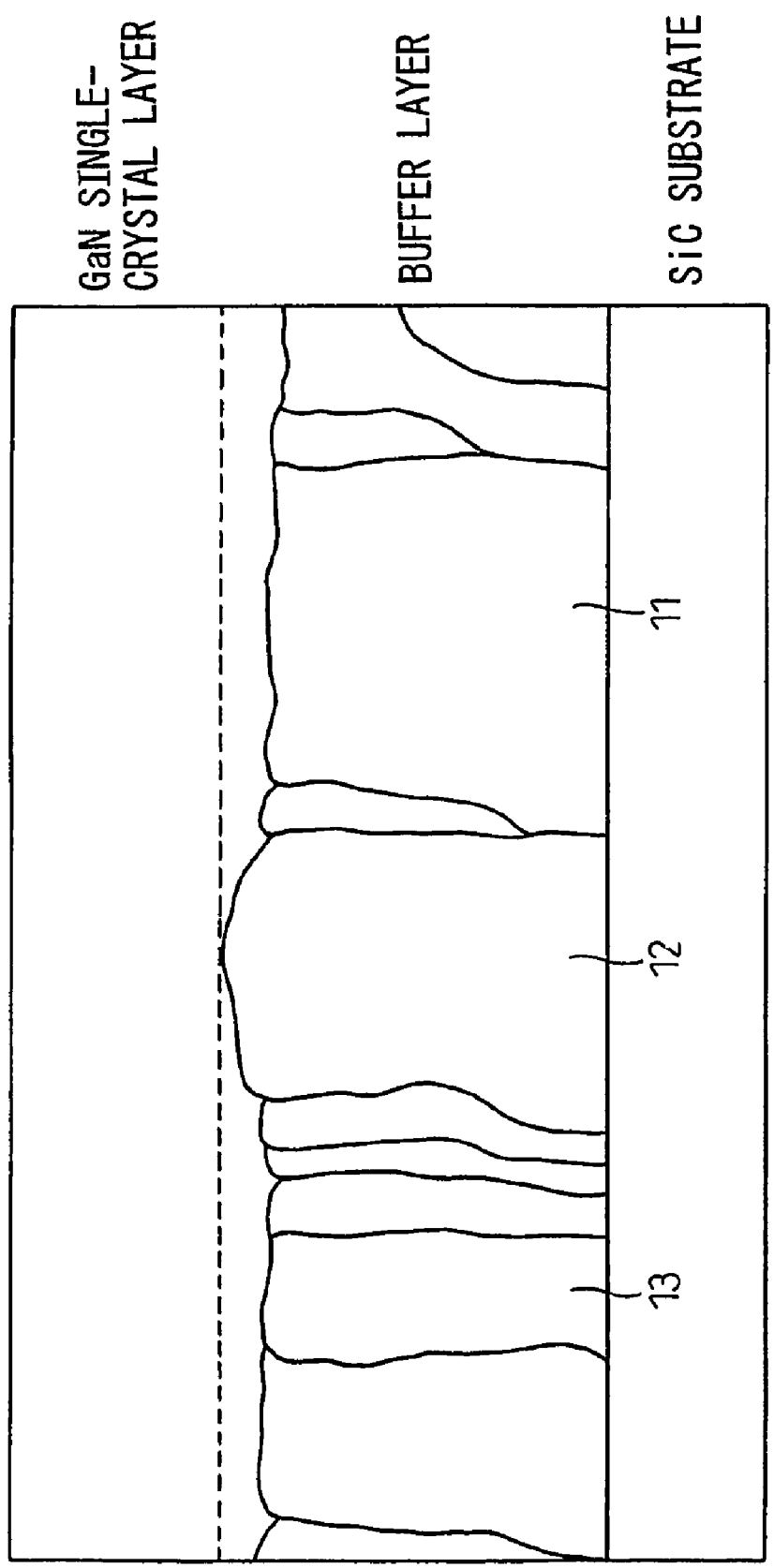

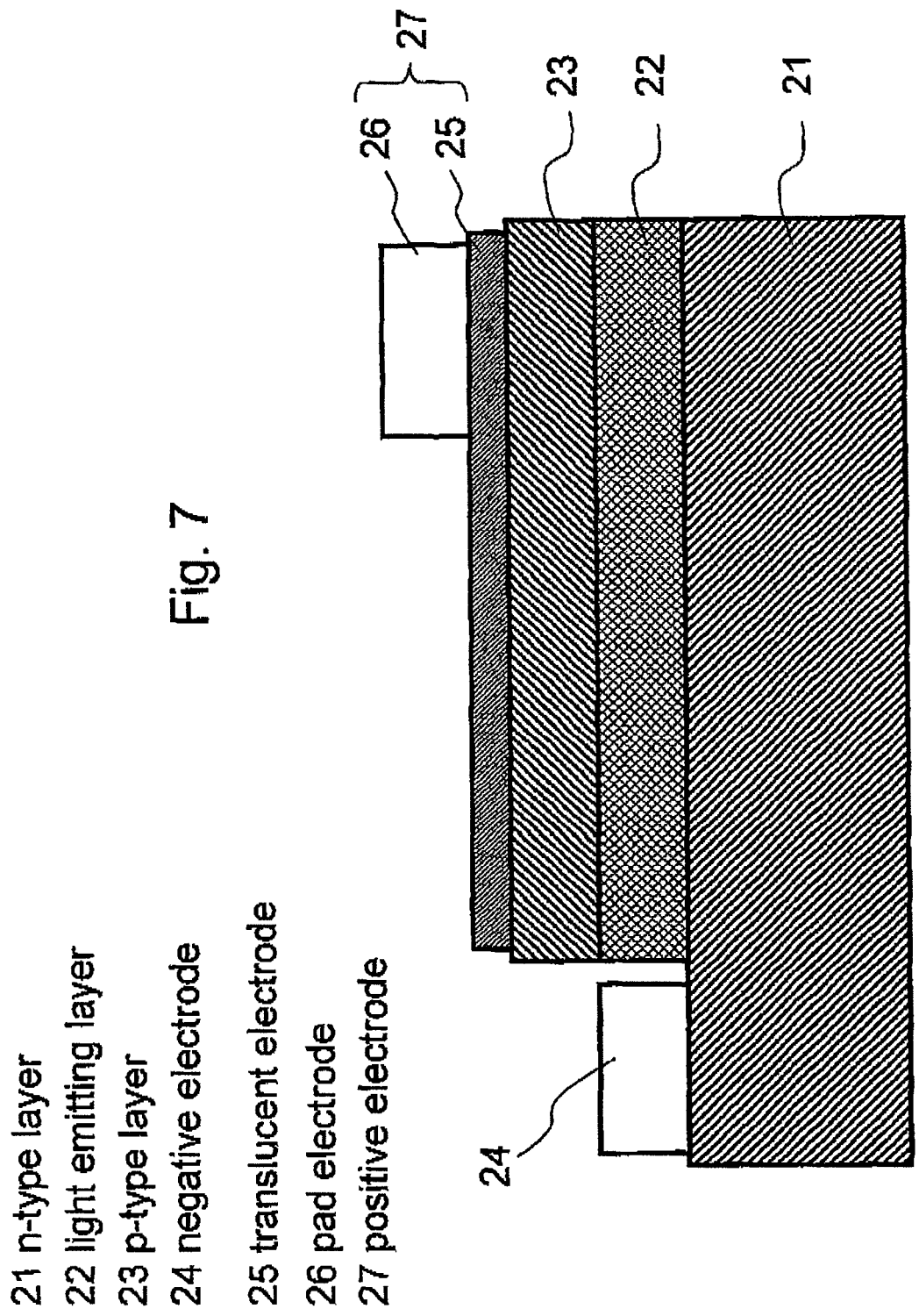

GROUP III NITRIDE SEMICONDUCTOR MULTILAYER STRUCTURE

CROSS REFERENCE TO RELATED APPLICATION

This application is an application filed under 35 U.S.C. §111(a) claiming benefit, pursuant to 35 U.S.C. §119(e) (1), of the filing date of the Provisional Application No. 60/541,071 filed on Feb. 3, 2004, pursuant to 35 U.S.C. §111(b).

TECHNICAL FIELD

The present invention relates to a Group III nitride semiconductor multilayer structure which is employed for producing, for example, light-emitting diodes (LEDs), laser diodes (LDs), and electronic devices. More particularly, the present invention relates to a Group III nitride semiconductor multilayer structure incorporating a substrate for growing a Group III nitride semiconductor, which substrate is prepared through a process under lenient working conditions and has a specific surface roughness.

BACKGROUND ART

Group III nitride semiconductors have a direct transition band structure exhibiting a bandgap energy corresponding to visible to ultraviolet light, and enable light emission of high efficiency. Therefore, Group III nitride semiconductors have been employed in LED and LD products. Meanwhile, at the hetero-junction interface between aluminum gallium nitride (AlGaN) and gallium nitride (GaN), a two-dimensional electron layer is generated due to the piezoelectric effect, which is a characteristic feature of a Group III nitride semiconductor. Therefore, even when employed in an electronic device, a Group III nitride semiconductor has a potential to exhibit characteristics which are not exhibited by a conventional Group III-V compound semiconductor.

However, a Group III nitride semiconductor single crystal is difficult to grow because nitrogen exhibits a dissociation pressure as high as 2,000 atm at a temperature at which the single crystal is grown. Therefore, unlike the case of a non-nitride Group III-V (except for a nitride) compound semiconductor, at present, difficulty is encountered in employing a Group III nitride semiconductor single crystal substrate for epitaxial growth of a Group III nitride semiconductor thereon. Thus, epitaxial growth of a Group III nitride semiconductor employs a substrate formed of a material other than Group III nitride semiconductor single crystal, such as sapphire ($Al_2O_3$) single crystal or silicon carbide (SiC) single crystal.

However, a large lattice mismatch exists between such a different-material substrate and a Group III nitride semiconductor crystal to be epitaxially grown on the substrate. For example, a 16% lattice mismatch exists between sapphire ($Al_2O_3$) and gallium nitride (GaN), whereas a 6% lattice mismatch exists between SiC and gallium nitride. In general, when such a large lattice mismatch exists between a substrate and a crystal to be grown thereon, it is difficult to epitaxially grow the crystal directly on the substrate, and the thus-grown crystal fails to exhibit good crystallinity. In view of the foregoing, in the case where a Group III nitride semiconductor crystal is to be epitaxially grown atop a sapphire single crystal substrate or an SiC single crystal substrate by means of metal organic chemical vapor deposition (MOCVD), there has generally been carried out a method disclosed in Japanese Patent No. 3026087 or Japanese Patent Application Laid-Open (kokai) No. 4-297023, in which a low-temperature buffer layer formed of aluminum nitride (AlN) or AlGaN is deposited onto a substrate, and a Group III nitride semiconductor crystal is epitaxially grown on the buffer layer at high temperature.

In addition to the aforementioned growth method employing a low-temperature buffer layer, there has been proposed a method (e.g., a method disclosed in Japanese Patent Application Laid-Open (kokai) No. 2003-243302) in which a Group III element source and a nitrogen source are fed onto a heated substrate such that the ratio of nitrogen to a Group III element becomes 1,000 or less, or merely a Group III element source (in the case where the nitrogen/Group III element ratio is zero) is fed onto the substrate, to thereby form a Group III nitride semiconductor; and subsequently a Group III nitride semiconductor single crystal is epitaxially grown by use of a Group III element source and a nitrogen source.

Meanwhile, a substrate having very low surface roughness is required for forming a Group III nitride semiconductor having a smooth surface and exhibiting excellent crystallinity. For example, Japanese Patent Application Laid-Open (kokai) No. 2002-255694 discloses a technique in which a buffer layer as described above is provided on a substrate having a surface roughness (Rms) of 0.1 nm or less and a surface roughness (Ra) of 0.06 nm or less, followed by growth of a Group III nitride semiconductor single crystal. However, when sapphire or silicon carbide, which has high hardness, is employed as a substrate for growing a Group III nitride semiconductor, a laborious step is required for attaining a very low surface roughness of the substrate, leading to an increase in production cost.

Japanese Patent Application Laid-Open (kokai) No. 2002-093726 discloses a technique for forming a Group III nitride semiconductor having reduced dislocation density and exhibiting excellent crystallinity, in which a substrate, on which a mask is provided, is subjected to etching to thereby form periodically arranged grooves on the surface of the substrate, and a Group III nitride semiconductor single crystal is grown on the substrate. However, provision of a mask on the substrate requires an intricate process, and increases the production cost.

DISCLOSURE OF INVENTION

An object of the present invention is to provide a Group III nitride semiconductor multilayer structure having a smooth surface and exhibiting excellent crystallinity, which multilayer structure employs a low-cost substrate that can be easily processed. Another object is to provide a Group III nitride semiconductor light-emitting device comprising the multilayer structure.

In the above-mentioned case where a Group III nitride semiconductor single crystal is to be epitaxially grown atop a substrate formed of a material other than a Group III nitride semiconductor, as disclosed in, for example, Japanese Patent No. 3026087 or Japanese Patent Application Laid-Open (kokai) No. 4-297023 or 2003-243302, generally, a buffer layer is formed on the surface of a substrate, and subsequently a Group III nitride semiconductor single crystal is epitaxially grown on the buffer layer.

The present inventor has found that when, as described above, a Group III nitride semiconductor single crystal is epitaxially grown, via a buffer layer, atop a substrate, growth of the single crystal tends to proceed. in a horizontal direction, in contrast to the case where a Group III nitride semiconductor single crystal is grown directly on a substrate; and that when a substrate having, on its surface, grooves having a specific average depth is employed, production cost can be reduced, and a Group III nitride semiconductor single-crystal layer having a smooth surface can be formed. The present invention has been accomplished on the basis of these findings.

Accordingly, the present invention provides the following.

(1) A Group III nitride semiconductor multilayer structure comprising a substrate; an $Al_xGa_{1-x}N$ ($0 \leq x \leq 1$) buffer layer which is provided on the substrate and has a columnar or island-like crystal structure; and an $Al_xIn_yGa_{1-x-y}N$ ($0 \leq x \leq 1$; $0 \leq y \leq 1$, $0 \leq x+y \leq 1$) single-crystal layer provided on the buffer layer, wherein the substrate has, on its surface, non-periodically distributed grooves having an average depth of 0.01 to 5 μm.

(2) A Group III nitride semiconductor multilayer structure according to (1) above, wherein the grooves have an average depth of 0.1 to 1 μm.

(3) A Group III nitride semiconductor multilayer structure according to (1) or (2) above, wherein the substrate is formed of sapphire single crystal or SiC single crystal.

(4) A Group III nitride semiconductor multilayer structure according to any one of (1) through (3) above, wherein the buffer layer contains columnar crystal grains.

(5) A Group III nitride semiconductor multilayer structure according to any one of (1) through (4) above, wherein the buffer layer has a thickness of 1 to 100 nm.

(6) A Group III nitride semiconductor multilayer structure according to any one of (1) through (5) above, wherein the buffer layer is formed through continuously feeding of a Group III element source and a nitrogen source such that the ratio of nitrogen to a Group III element becomes 1,000 or less, or through feeding of merely a Group III element source (in the case where the nitrogen/Group III element ratio is zero).

(7) A Group III nitride semiconductor multilayer structure according to any one of (1) through (6) above, wherein the single-crystal layer has a thickness of 1 to 20 μm.

(8) A Group III nitride semiconductor multilayer structure according to any one of (1) through (7) above, wherein the single-crystal layer is formed through feeding of a Group III element source and a nitrogen source such that the nitrogen/Group III element ratio becomes 1,600 to 3,200.

(9) A Group III nitride semiconductor multilayer structure according to any one of (1) through (8) above, wherein the single-crystal layer is formed while the temperature of the substrate is regulated so as to fall within a range of 1,000 to 1,300° C.

(10) A Group III nitride semiconductor multilayer structure according to (9) above, wherein the temperature of the substrate is regulated so as to fall within a range of 1,050 to 1,200° C.

(11) A Group III nitride semiconductor light-emitting device comprising a Group III nitride semiconductor multilayer structure according to any one of (1) through (10) above; Group III nitride semiconductor layers provided atop the single-crystal layer of the semiconductor multilayer structure, the semiconductor layers including an n-type layer, a light-emitting layer, and a p-type layer; and a negative electrode and a positive electrode which are provided at predetermined positions.

(12) A Group III nitride semiconductor light-emitting device according to (11) above, wherein the n-type layer, the light-emitting layer, and the p-type layer, which constitute the Group III nitride semiconductor layers, are successively provided atop the single-crystal layer in this order; the negative electrode is provided on the n-type layer; and the positive electrode is provided on the p-type layer.

(13) A substrate for forming a Group III nitride semiconductor, which has, on its surface, non-periodically distributed grooves having an average depth of 0.01 to 5 μm.

(14) A substrate for forming a Group III nitride semiconductor according to (13) above, wherein the grooves have an average depth of 0.1 to 1 μm.

(15) A substrate for forming a Group III nitride semiconductor according to (13) or (14) above, which is formed of sapphire single crystal or SiC single crystal.

(16) A method for producing a Group III nitride semiconductor multilayer structure, comprising a step of forming an $Al_xGa_{1-x}N$ ($0 \leq x \leq 1$) buffer layer by feeding, onto a heated substrate which has, on its surface, non-periodically distributed grooves having an average depth of 0.01 to 5 μm, a Group III element source and a nitrogen source such that the ratio of nitrogen to a Group III element becomes 1,000 or less, or by feeding, onto the substrate, merely a Group III element source (in the case where the nitrogen/Group III element ratio is zero); and subsequently a step of vapor-growing an $Al_xIn_yGa_{1-x-y}N$ ($0 \leq x \leq 1$, $0 \leq y \leq 1$, $0 \leq x+y \leq 1$) single-crystal layer atop the buffer layer by use of a Group III element source and a nitrogen source.

(17) A method for producing a Group III nitride semiconductor multilayer structure, comprising a buffer layer formation step in which a Group III element source and a nitrogen source are fed onto a substrate having, on its surface, non-periodically distributed grooves having an average depth of 0.01 to 5 μm, while the temperature of the substrate is maintained at 400 to 600° C., to thereby form an $Al_xGa_{1-x}N$ ($0 \leq x \leq 1$) layer, and subsequently feeding of the Group III element source is stopped, followed by thermal treatment at 900 to 1,000° C.; and subsequently a step of vapor-growing an $Al_xIn_yGa_{1-x-y}N$ ($0 \leq x \leq 1$, $0 \leq y \leq 1$, $0 \leq x+y \leq 1$) single-crystal layer atop the buffer layer by use of a Group III element source and a nitrogen source.

According to the present invention, when an $Al_xGa_{1-x}N$ ($0 \leq x \leq 1$) layer having a columnar or island-like crystal structure is provided on a substrate, and an $Al_xIn_yGa_{1-x-y}N$ ($0 \leq x \leq 1$, $0 \leq y \leq 1$, $0 \leq x+y \leq 1$) single-crystal layer is epitaxially grown on the $Al_xGa_{1-x}N$ layer, even if the substrate has, on its surface, non-periodically distributed grooves having an average depth of 0.01 to 5 μm, a Group III nitride semiconductor having a smooth surface and exhibiting excellent crystallinity can be obtained.

That is, according to the present invention, a Group III nitride semiconductor having a smooth surface and exhibiting excellent crystallinity can be obtained, without surface smoothing of a substrate cut out of an ingot or with simple surface smoothing of the substrate, or without formation of periodically arranged grooves on the substrate by means of etching by use of a mask. Therefore, a substrate working process can be simplified considerably, and production cost can be reduced.

BRIEF DESCRIPTION OF THE DRAWINGS

FIG. 6 is a schematic representation of the micrograph shown in FIG. 5.

FIG. 7 is a schematic representation of an exemplary group III nitride semiconductor light-emitting device according to the present invention.

BEST MODE FOR CARRYING OUT THE INVENTION

Figure 1:
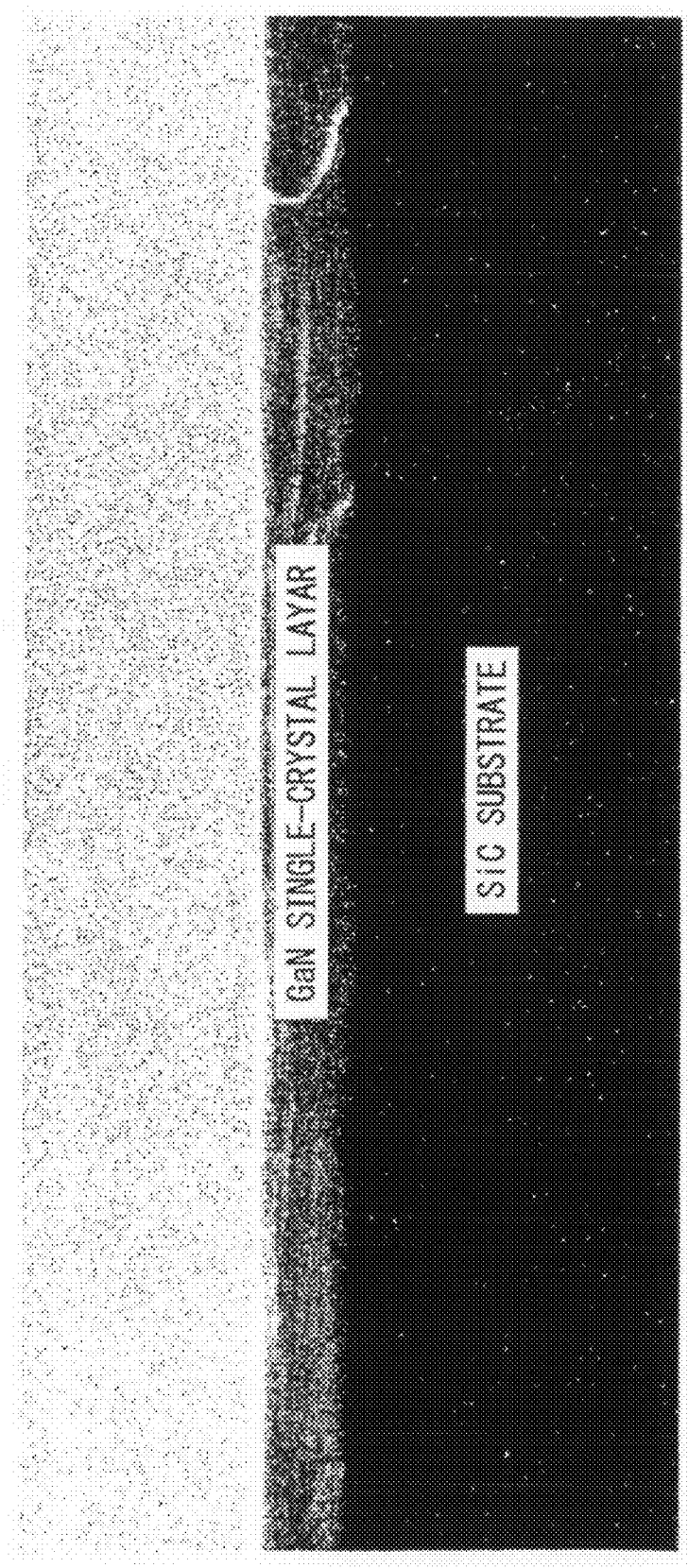
FIG. 1 is an SEM micrograph (magnification: 2,000) showing the cross section of the Group III nitride semiconductor multilayer structure produced in Example 1.

FIG. 7 is a schematic representation showing a general structure of an exemplary group III nitride semiconductor light-emitting device according to the present invention, including an n-type layer 21, a p-type layer 23, light emitting layer 22, a negative electrode 24, and a positive electrode 27. In FIG. 7, positive electrode 27 is composed of translucent electrode 25 and pad electrode 26.

No particular limitations are imposed on the material of the substrate of the Group III nitride semiconductor multilayer structure of the present invention, and the substrate may be formed of any known material. Examples of the known material include oxide single crystals such as sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; and boride single crystals such as $ZrB_2$ single crystal. Of these materials, sapphire single crystal or SiC single crystal is preferred. No particular limitations are imposed on the crystal orientation of the substrate. The substrate may be a just substrate or a substrate having an off-angle.

The substrate is generally cut out of a single crystal ingot so as to have a thickness of 250 to 1,000 μm. When the substrate is cut out of the ingot, non-periodically distributed grooves (scratches) are formed on a surface of the substrate. In the present invention, the average depth of the non-periodically distributed grooves present on the surface of the substrate is preferably 0.01 to 5 μm. When the average depth of the grooves exceeds 5 μm, the surface smoothness of the resultant semiconductor multilayer structure is impaired, which is not preferred. In contrast, when the average depth of the grooves is to be reduced to 0.01 μm or less, much is required for working of the substrate, leading to an increase in production cost. The average depth of the grooves is more preferably 0.1 to 1 μm, particularly preferably 0.2 to 0.5 μm.

Figure 2:
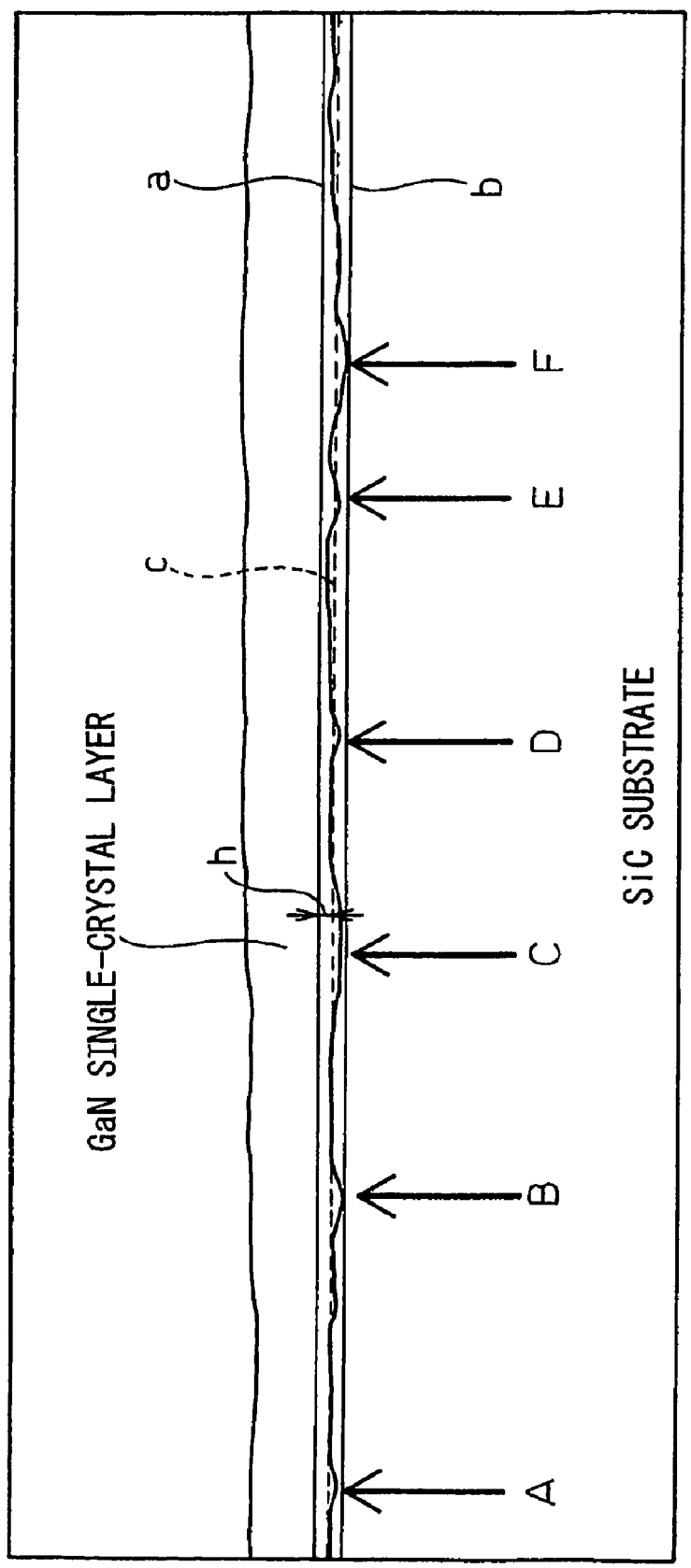
FIG. 2 is a schematic representation of the micrograph shown in FIG. 1.

As used herein, the expression "non-periodically distributed" refers to the case where grooves are not oriented in the same direction, or the case where grooves are oriented in the same direction but the intervals between the grooves are not equal to one another. FIG. 1 is an SEM micrograph (magnification: 2,000) showing a cross section of a Group III nitride semiconductor multilayer structure produced in Example 1, and FIG. 2 is a schematic representation of the micrograph shown in FIG. 1. As shown in FIG. 2, six grooves are provided at positions A, B, C, D, E, and F, and intervals between these grooves are not equal to one another.

As used herein, the term "groove" refers to a depressed portion in a surface layer of a substrate. The bottom of each groove is present at a level lower than the level of an intermediate plane (c in FIG. 2) between the top portion (a in FIG. 2) and the bottom portion (b in FIG. 2) of the surface layer of the substrate of the substrate shown in an SEM micrograph of a cross section of the substrate. As used herein, the term "average depth of a groove" refers to the depth of the intermediate plane (h in FIG. 2).

So long as the depth of grooves on the substrate surface falls within the aforementioned range, the width of a groove and the interval between adjacent grooves do not greatly affect the surface smoothness of the resultant semiconductor. Generally, the width of a groove on the substrate surface is 0.1 to 10 μm, and the interval between adjacent grooves is 5 to 20 μm.

No particular limitations are imposed on the method for cutting the substrate out of an ingot, and there may employed any known method, such as a batch slicing method employing an electrodeposited wire saw or a sequential cutting method employing an internal blade. Among these methods, a batch slicing method employing an electrodeposited wire saw is preferred, since this method enables a number of substrates to be cut out of an ingot in a single cutting step.

If desired (e.g., when the average depth of grooves is 5 μm or more), the substrate cut out of an ingot may be subjected to a treatment to attain a uniform thickness, such as polishing by use of a grinding wheel (e.g., a diamond grinding wheel).

A process-affected layer is present on a surface of the substrate cut out of an ingot, or on the surface of the substrate which has undergone a treatment to attain a uniform thickness. Preferably, the process-affected layer is removed from the substrate, since there is a high possibility that the process-affected layer adversely affects subsequent formation of a buffer layer and a single-crystal layer.

No particular limitations are imposed on the technique for removing the process-affected layer, and the process-affected layer may be removed by means of a generally employed technique, such as thermal oxidation at 800 to 1,000° C., sacrificial oxidation employing $O_2$ plasma, etc., etching with halogen gas plasma, surface sublimation at a substrate temperature of 1,500 to 1,800° C., or etching with, for example, hot phosphoric acid or molten KOH.

The composition of the buffer layer, which is formed of a compound represented by $Al_xGa_{1-x}N$ ($0 \leqq x \leqq 1$) (i.e., a compound containing N, and Al and/or Ga), may be appropriately determined in accordance with the type of a Group III nitride semiconductor single crystal which is to be grown on the buffer layer. The buffer layer may be formed solely of AlN (i.e., a compound containing no Ga), or solely of GaN (i.e., a compound containing no Al).

The buffer layer is formed by means of a specific method known to those skilled in the art. In one method, a Group III element source and a nitrogen source are fed onto a heated substrate such that the ratio of nitrogen to a Group III element becomes 1,000 or less, or merely a Group III element source (in the case where the nitrogen/Group III element ratio is zero) is fed onto the substrate, to thereby form an $Al_xGa_{1-x}N$ ($0 \leqq x \leqq 1$) buffer layer. The detail of this method is disclosed in, for example, Japanese Patent Application Laid-Open (kokai) No. 2003-243302. The reason why the $Al_xGa_{1-x}N$ ($0 \leqq x \leqq 1$) layer is formed without feeding of a nitrogen source is that nitrogen is supplied to the substrate through decomposition of a product which is deposited on the inner walls and ceiling of a reaction furnace and on a susceptor. As used herein, the term "the nitrogen/Group III element ratio" refers to the ratio by mole of a nitrogen source to a Group III element source, which are fed onto a substrate.

In another method, a Group III element source and a nitrogen source are fed onto a substrate whose temperature is regulated to a relatively low level (i.e., about 400° C. to about 600° C.), to thereby form an $Al_xGa_{1-x}N$ ($0 \leqq x \leqq 1$) layer, and subsequently feeding of the Group III element source is stopped, followed by thermal treatment (which is called "crystallization") of the layer at 900° C. to 1,000° C. The detail of this method (i.e., the method for forming a low-temperature buffer layer) is disclosed in, for example, Japanese Patent No. 3026087 or Japanese Patent Application Laid-Open (kokai) No. 4-297023.

When the buffer layer formed of $Al_xGa_{1-x}N$ ($0 \leq x \leq 1$) has an island-like or columnar crystal structure, horizontal growth of a Group III nitride semiconductor single crystal which is to be formed on the buffer layer is further promoted, which is preferred.

Figure 3:
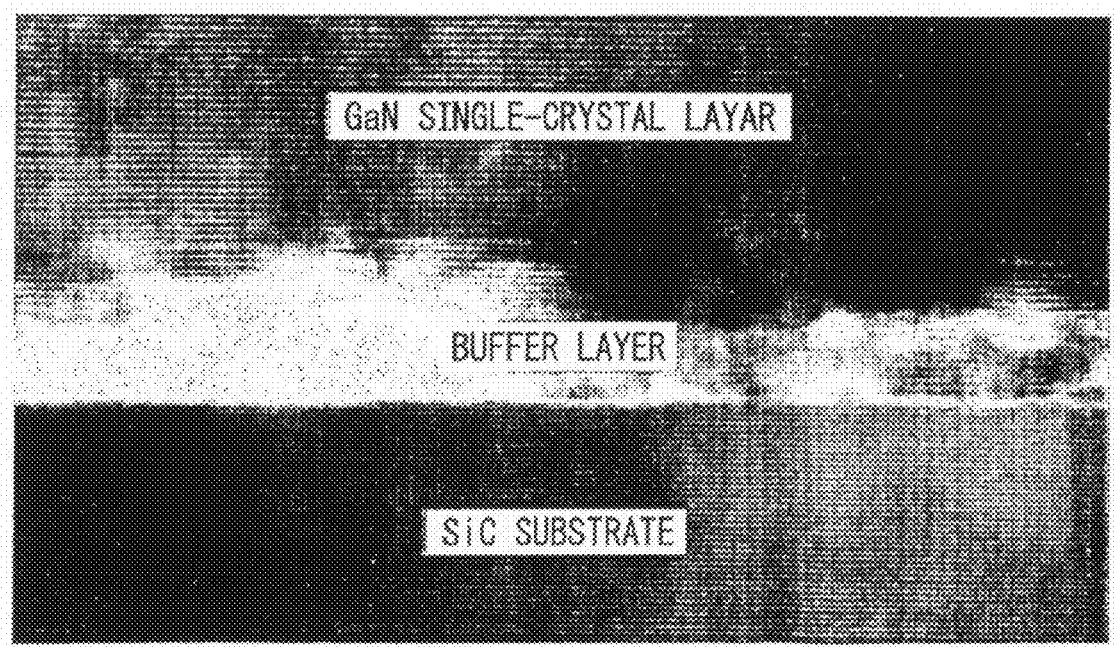
FIG. 3 is a TEM micrograph (magnification: 2,000,000) showing the cross section of the Group III nitride semiconductor multilayer structure produced in Example 1.
Figure 4:
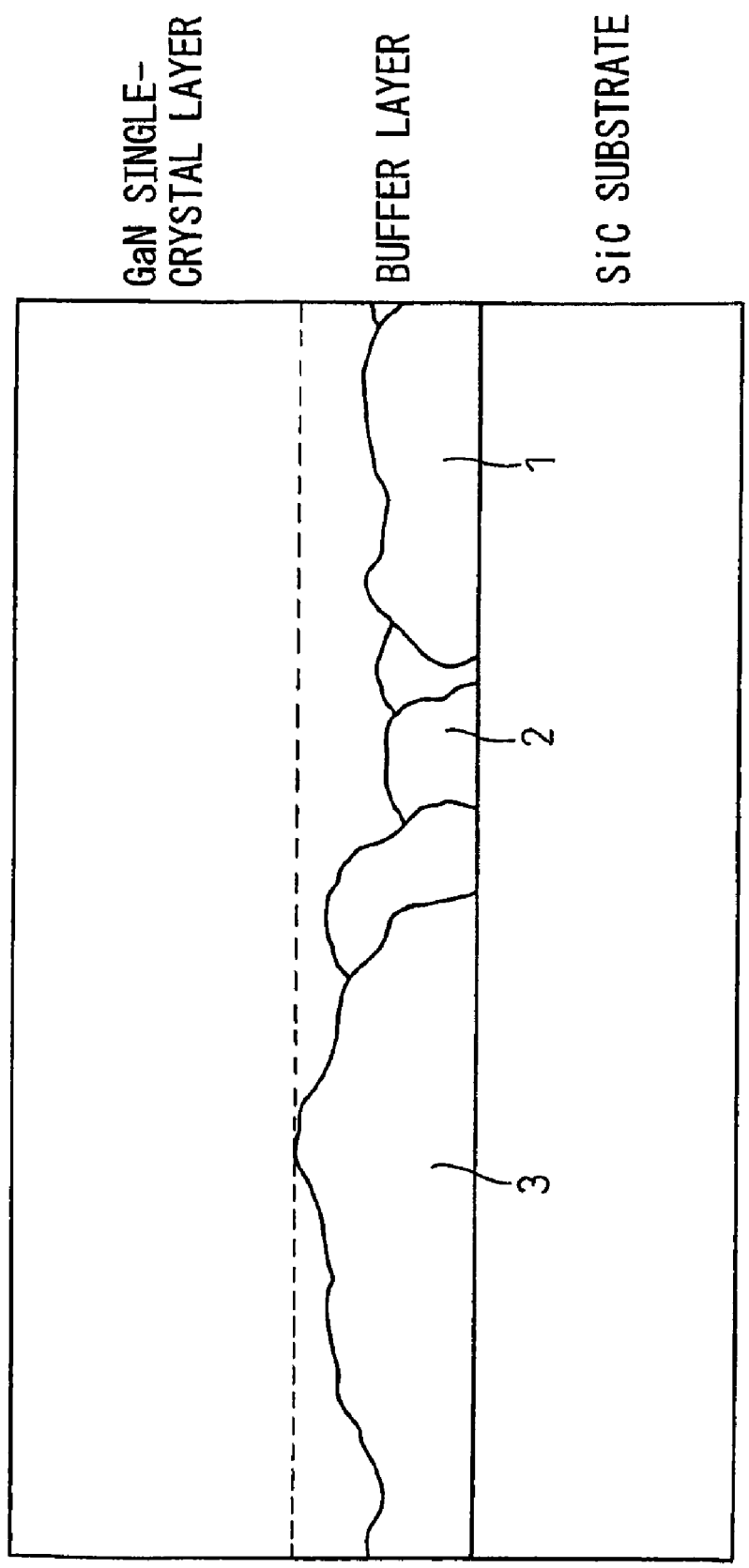
FIG. 4 is a schematic representation of the micrograph shown in FIG. 3.

As used herein, the term "island-like crystal structure" refers to a crystal structure formed of aggregated island-like crystal grains, each grain having a width of about 1 nm to about 500 nm and a height of about 5 nm to about 100 nm. The island-like crystal structure may be a structure in which island-like crystal grains are not so densely distributed that the substrate surface is exposed between the crystal grains. FIG. 3 is a TEM micrograph (magnification: 2,000,000) of a cross section of a Group III nitride semiconductor multilayer structure of Example 1, and FIG. 4 is a schematic representation of the micrograph shown in FIG. 3. In FIG. 4, reference numerals 1, 2, and 3 denote island-like crystal grains.

Figure 5:
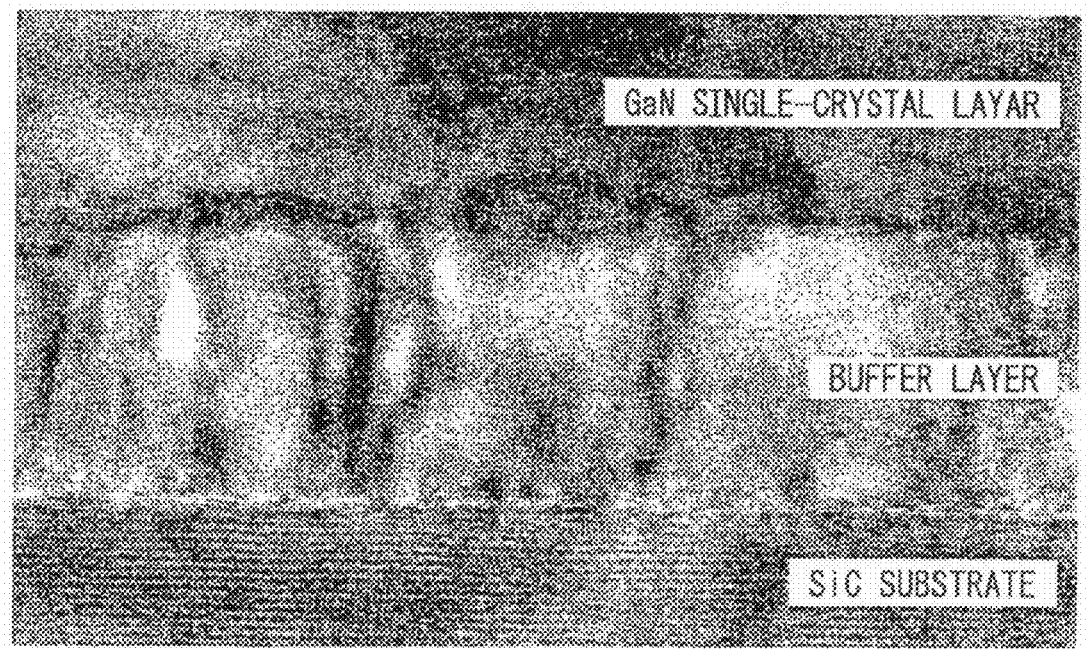
FIG. 5 is a TEM micrograph (magnification: 500,000) showing the cross section of the Group III nitride semiconductor multilayer structure produced in Example 4.

As used herein, the term "columnar crystal structure" refers to a crystal structure formed of aggregated columnar crystal grains, each grain having a width of about 0.1 nm to about 100 nm and a height of about 10 nm to about 500 nm. FIG. 5 is a TEM micrograph (magnification: 500,000) of a cross section of a Group III nitride semiconductor multilayer structure of Example 4, and FIG. 6 is a schematic representation of the micrograph shown in FIG. 5. In FIG. 6, reference numerals 11, 12, and 13 denote columnar crystal grains.

The thickness of the buffer layer is preferably 1 nm or more. When the buffer layer thickness is less than 1 nm, a semiconductor multilayer structure having a smooth surface cannot be produced. The buffer layer thickness is more preferably 5 nm or more and most preferably 10 nm or more. When the buffer layer has a columnar crystal structure, the thickness thereof is particularly preferably 20 nm or more. No particular limitations are imposed on the maximum value of the thickness of the buffer layer. However, even when the thickness of the buffer layer is increased to 200 nm or more, epitaxial growth of a nitride semiconductor single crystal on the buffer layer is not considerably affected by the layer thickness. In addition, when the thickness of the buffer layer is to be increased to a level more than necessary, a long period of time is required for growth thereof, which is not desirable. The thickness of the buffer layer is preferably regulated to 100 nm or less. When the buffer layer has an island-like or columnar crystal structure, the thickness of the thickest portion of the buffer layer is defined as the thickness of the buffer layer, although protrusions and depressions are generally present at the interface between the buffer layer and the single-crystal layer grown thereon.

The Group III element source to be employed for forming the buffer layer may be, for example, trimethylaluminum (TMA), triethylaluminum (TEA), tert-butylaluminum, trimethylgallium (TMG), triethylgallium (TEG), tert-butylgallium, or a mixture thereof. The nitrogen source to be employed may be ammonia, hydrazine, an alkylamine, or a mixture thereof. The carrier gas to be employed may be hydrogen, nitrogen, or a mixture thereof.

The composition of the $Al_xIn_yGa_{1-x-y}N$ ($0 \leq x \leq 1$, $0 \leq y \leq 1$, $0 \leq x+y \leq 1$) single-crystal layer, which is to be formed on the buffer layer, may be appropriately selected in accordance with the intended use of the resultant semiconductor device. From the viewpoint of horizontal growth of the single-crystal layer, undoped $Al_xIn_yGa_{1-x-y}N$ or n-type $Al_xIn_yGa_{1-x-y}N$ doped with a relatively small amount of Si or Ge is preferred. Alternatively, p-type Mg-doped $Al_xIn_yGa_{1-x-y}N$ is selected in accordance with the intended use of the semiconductor device.

In order to level protrusions and depressions present at the substrate surface, to attain a semiconductor multilayer structure having a smooth surface, the single-crystal layer must have a certain thickness. The thickness of the single-crystal layer is preferably 1 μm or more, more preferably 2 μm or more, particularly preferably 3 μm or more. No particular limitations are imposed on the maximum value of the thickness of the single-crystal layer. However, the thickness must be determined in consideration of device characteristics, since increasing the single-crystal layer thickness to a level more than necessary leads only to an increase in production cost. In the present invention, when the thickness of the single-crystal layer is 20 μm, the resultant semiconductor multilayer structure exhibits satisfactory smoothness. The thickness of the single-crystal layer is preferably 10 μm or less.

There are various known methods and conditions for growing an $Al_xIn_yGa_{1-x-y}N$ ($0 \leq x \leq 1$, $0 \leq y \leq 1$, $0 \leq x+y \leq 1$) single crystal. So long as an $Al_xIn_yGa_{1-x-y}N$ single crystal is grown, any growth method and conditions may be employed.

From the viewpoint of promotion of horizontal growth of the single-crystal layer, the temperature of the substrate is preferably regulated to a somewhat high level (specifically 1,000 to 1,300° C.), more preferably 1,050 to 1,200° C. From the viewpoint similar to the above, in raw material gases, the ratio of nitrogen to a Group III element is preferably regulated to a high level (specifically 1,600 to 3,200).

The Al, Ga, and N sources to be employed for forming the single-crystal layer may be similar to those employed for forming the buffer layer. When the composition of the single-crystal layer contains In, trimethylindium (TMI), triethylindium (TEI), tert-butylindium, cyclopentadienylindium, or a similar material can be employed as an In source.

When group III nitride semiconductor single-crystal layers of different compositions and configurations are formed atop the Group III nitride semiconductor multilayer structure of the present invention, a target semiconductor device can be produced. For example, when a light-emitting device is to be produced, an n-type layer, a light-emitting layer, and a p-type layer, which are formed of a Group III nitride semiconductor single crystal, are successively provided atop the Group III nitride semiconductor multilayer structure of the present invention in this order, and a negative electrode and a positive electrode are provided on the n-type layer and the p-type layer, respectively, by means of a customary technique.

In the case where the substrate is formed of SiC single crystal, a negative electrode can be provided on the substrate because the SiC single crystal exhibits electrical conductivity. In this case, preferably, the $Al_xGa_{1-x}N$ ($0 \leq x \leq 1$) single-crystal layer is doped with a small amount of an n-type dopant (e.g., Si or Ge).

Meanwhile, in the case where the substrate is formed of p-type SiC single crystal, the $Al_xGa_{1-x}N$ ($0 \leq x \leq 1$) single-crystal layer is doped with Mg so that the layer exhibits p-type conductivity. In this case, a p-type layer, a light-emitting layer, and an n-type layer are successively formed atop the single-crystal layer in this order, and a positive electrode and a negative electrode are provided on the substrate and the n-type layer, respectively, to thereby produce a light-emitting device.

EXAMPLES

Example 1

A plate-like SiC single crystal substrate having a thickness of 450 μm was cut out of an n-SiC ingot through batch slicing by use of a #400 electrodeposited wire saw. During the course of slicing, non-periodically distributed grooves (scratches) (density: several to 10 grooves/0.1 mm) were formed on the cut surface of the substrate. The depth of the deepest groove was found to be about 1 μm; i.e., the average depth of the grooves was found to be about 0.5 μm.

After the substrate was washed with acetone, the substrate was subjected to surface etching treatment by use of a dry etching apparatus, so as to remove a process-affected layer from the substrate. Specifically, the substrate was subjected to five-minute etching treatment by use of chlorine-containing gas under the following conditions: RF power: 1 kW, bias power: 300 W. The average etching depth was regulated to 2 μm. The non-periodically distributed grooves were observed to remain on the substrate even after the etching treatment, but the depth of the grooves was reduced. Specifically, the depth of the deepest groove became 0.8 μm; i.e., the average depth of the grooves became about 0.4 μm.

Subsequently, the silicon carbide substrate which had undergone the etching treatment employing chlorine-containing gas was subjected to an oxidation treatment employing oxygen in the etching apparatus, to thereby remove the etching residue from the substrate surface and form an oxide film on the substrate surface. This oxide film formation is performed for the purpose of keeping the substrate surface clean until the substrate is subjected to treatment with hydrofluoric acid immediately before epitaxial growth of a buffer layer.

Next, the procedure for growing a buffer layer and a single-crystal layer atop the above-treated substrate will be described. The procedure produces the Group III nitride semiconductor multilayer structure of the present invention.

The substrate having the above-formed oxide film was washed with diluted hydrofluoric acid (HF:H$_2$O=1:1) and dried, and subsequently the resultant substrate was brought into an epitaxial growth apparatus. The substrate was placed on an SiC-coated graphite jig, and the temperature of the substrate was elevated to 1,100° C. under hydrogen flow in the growth apparatus (in which the substrate temperature is measured by a thermocouple inserted in the graphite jig and controlled), to thereby remove the oxide film (natural oxide film) remaining on the substrate surface.

After removal of the oxide film, the substrate temperature was lowered to 600° C., and TMG-entraining hydrogen gas (20 sccm), which had been obtained through bubbling hydrogen gas into TMG (Group III element source), and NH$_3$ (nitrogen source) (4 slm) were fed into the growth apparatus for 10 minutes. Thereafter, feeding of the Group III element source was stopped, and the substrate temperature was elevated to 900° C., followed by thermal treatment for five minutes, to thereby form a GaN buffer layer. As used herein, the term "sccm" refers to cm$^3$/min and the term "slm" refers to l/min, wherein each volume is converted to a volume normal state.

Subsequently, the substrate temperature was elevated to 1,100° C., and TMG-entraining hydrogen gas (20 sccm), which had been obtained through bubbling hydrogen gas into TMG (Group III element source), and NH$_3$ (nitrogen. source) (4 slm) were fed into the growth apparatus, to thereby grow a GaN single-crystal layer (thickness: 4 μm), yielding the Group III nitride semiconductor multilayer structure of the present invention. The nitrogen/Group III element ratio was 1,600. The GaN single-crystal layer was found to have a surface roughness (Ra) of 20 nm; i.e., a very smooth surface.

FIG. 1 is an SEM micrograph (magnification: 2,000) showing the cross section of the Group III nitride semiconductor multilayer structure produced in the present Example, and FIG. 2 is a schematic representation of the micrograph. As is clear from these figures, the SiC substrate has, on its surface, non-periodically distributed grooves, and the average depth of the grooves is 0.4 μm. FIG. 3 is a TEM micrograph (magnification: 2,000,000) of the cross section of the Group III nitride semiconductor multilayer structure, and FIG. 4 is a schematic representation of the micrograph. As is clear from these figures, the buffer layer has an island-like crystal structure and a thickness of 10 nm.

Example 2

The procedure of Example 1 was repeated, except that the temperature for growth of a GaN single-crystal layer was regulated to 1,000° C., to thereby produce a Group III nitride semiconductor multilayer structure. The thus-produced semiconductor multilayer structure exhibited satisfactory smoothness, although a small amount of pits remained on the surface of the multilayer structure, and the surface roughness (Ra) of the multilayer structure was found to be 100 nm, which is high when compared with the case of the semiconductor multilayer structure of Example 1.

Example 3

By use of the Group III nitride semiconductor multilayer structure of Example 1, a GaN-type light-emitting device which emits light having a wavelength of 460 nm was produced by means of a method known in the art.

Specifically, after growth of the GaN single-crystal layer in Example 1, an n-type layer formed of a silicon-doped GaN layer (carrier concentration: $1 \times 10^{19}$/cm$^3$) was laminated by use of SiH$_4$ serving as a dopant. Thereafter, the substrate temperature was lowered to 750° C., and an MQW light-emitting layer formed of five layer units, each including an In$_{0.16}$Ga$_{0.84}$N layer (thickness: 3 nm) and a GaN layer (thickness: 7 nm), was laminated. Subsequently, the substrate temperature was elevated again, and a p-type layer (thickness: 100 nm) formed of a magnesium-doped GaN layer was laminated.

Subsequently, a portion of the p-type layer and a portion of the light-emitting layer were removed through typical photolithography and dry etching techniques, to thereby expose the silicon-doped n-type layer to the outside. Thereafter, a Ti/Al negative electrode was formed on the thus-exposed n-type layer, and a positive electrode including an NiO/Au translucent electrode and an Au pad electrode was formed on the remaining portion of the p-type layer, to thereby produce a light-emitting device.

The thus-produced light-emitting device was subjected to performance evaluation, and the device was found to exhibit good performance. Specifically, the device exhibited an emission output of 4 mW and a forward voltage of 3.2 V at a current of 20 mA.

Example 4

A plate-like substrate which had been cut out of an ingot in a manner similar to that of Example 1 was subjected to a treatment to attain a uniform thickness by use of a #400 diamond grinding wheel until the thickness of the substrate became 350 μm, to thereby improve the surface roughness of the substrate. Non-periodically distributed grooves (scratches) were formed on the surface of the substrate. The depth of the deepest groove was found to be about 0.6 μm; i.e., the average depth of the grooves was found to be 0.3 μm. That is, the groove depth became smaller than that before the treatment to attain a uniform thickness.

The thus-treated substrate was subjected to etching treatment by use of hot phosphoric acid (240° C.) for 10 minutes, so as to remove a process-affected layer from the substrate. Through this etching treatment, the depth of the grooves on the substrate surface was reduced. Specifically, the depth of the deepest groove became about 0.4 µm; i.e., the average depth of the grooves became 0.2 µm. The substrate which had undergone etching was washed with water, and then an oxide film was formed on the substrate surface in a thermal oxidation furnace.

A buffer layer was formed by means of the method disclosed in Japanese Patent Application Laid-Open (kokai) No. 2003-243302. Specifically, the procedure of Example 1 was repeated until removal of the oxide film (natural oxide film) on the substrate surface. While the substrate temperature was maintained at 1,100° C., a valve for feeding ammonia was opened, to thereby initiate feeding of ammonia into the furnace. Subsequently, valves for feeding TMG and TMA were simultaneously opened, and hydrogen gas containing TMG vapor and TMA vapor was fed into the reaction furnace, to thereby form an AlGaN buffer layer on the substrate. The feed amounts of TMG and TMA were regulated such that the ratios by mole of TMG to TMA became 2:1, and the feed amount of ammonia was regulated such that the ratio of nitrogen to a Group III element became 85.

After the buffer layer formation had been performed for six minutes, the valves for feeding TMG and TMA were simultaneously closed, to thereby stop feeding of hydrogen gas containing TMG vapor and TMA vapor into the reaction furnace. Subsequently, feeding of ammonia was also stopped, and annealing was performed for three minutes. After the three-minute annealing, the valve for feeding ammonia gas was opened, and feeding of ammonia gas into the furnace was resumed. Subsequently, annealing was performed for four minutes under an ammonia flow.

Subsequently, a GaN single-crystal layer (thickness: 4 µm) was formed, to thereby produce the Group III nitride semiconductor multilayer structure of the present invention. Growth of the GaN single-crystal layer was performed by feeding ammonia (8 slm) and TMG-vapor-containing hydrogen carrier gas (20 sccm) such that the ratio of nitrogen to a Group III element became 3,200, while the substrate temperature was regulated to 1,100° C. In addition, $SiH_4$ was fed into the furnace, and the layer was doped with silicon. The feed amount of $SiH_4$ was regulated such that the Si content of the single-crystal layer became a relatively low level (specifically, $1 \times 10^{18}/cm^3$), since the rate of vertical growth of the crystal layer increases as the Si content increases.

The GaN single-crystal layer of the thus-produced semiconductor multilayer structure was found to have a surface roughness (Ra) of 20 nm; i.e., a very smooth surface. FIG. 5 is a TEM micrograph (magnification: 500,000) of the cross section of the Group III nitride semiconductor multilayer structure of the present Example, and FIG. 6 is a schematic representation of the micrograph. As is clear from these figures, the buffer layer has a columnar crystal structure and a thickness of 50 nm.

Example 5

In a manner similar to that of Example 3, a light-emitting device was produced by use of the Group III nitride semiconductor multilayer structure of Example 4. However, in this case, a negative electrode was formed, through deposition of nickel, on the back surface of the SiC substrate, which exhibits electrical conductivity.

The thus-produced light-emitting device was subjected to performance evaluation, and the device was found to exhibit good performance. Specifically, the device exhibited an emission output of 4 mW and a forward voltage of 3.5 V at a current of 20 mA.

INDUSTRIAL APPLICABILITY

When the Group III nitride semiconductor multilayer structure of the present invention is employed in, for example, a light-emitting diode (LED), a laser diode (LD), or an electronic device, the process for producing such a device is simplified, leading to reduction in production cost. Therefore, the Group III nitride semiconductor multilayer structure has very high industrial value.

The invention claimed is:

1. A Group III nitride semiconductor multilayer structure comprising a substrate; an $Al_xGa_{1-x}N$ ($0 \leq x \leq 1$) buffer layer which is provided on the substrate and has a columnar or island-like crystal structure; and an $Al_xIn_yGa_{1-x-y}N$ ($0 \leq x \leq 1$, $0 \leq y \leq 1$, $0 \leq x+y \leq 1$) single-crystal layer provided on the buffer layer, wherein the substrate has, on its surface, non-periodically distributed scratches having an average depth of 0.01 to 5 µm.

2. A Group III nitride semiconductor multilayer structure according to claim 1, wherein the grooves have an average depth of 0.1 to 1 µm.

3. A Group III nitride semiconductor multilayer structure according to claim 1, wherein the substrate is formed of sapphire single crystal or SiC single crystal.

4. A Group III nitride semiconductor multilayer structure according to claim 1, wherein the buffer layer contains columnar crystal grains.

5. A Group III nitride semiconductor multilayer structure according to claim 1, wherein the buffer layer has a thickness of 1 to 100 nm.

6. A Group III nitride semiconductor multilayer structure according to claim 1, wherein the buffer layer is formed through continuously feeding of a Group III element source and a nitrogen source such that the ratio of nitrogen to a Group III element becomes 1,000 or less, or through feeding of merely a Group III element source (in the case where the nitrogen/Group III element ratio is zero).

7. A Group III nitride semiconductor multilayer structure according to claim 1, wherein the single-crystal layer has a thickness of 1 to 20 µm.

8. A Group III nitride semiconductor multilayer structure according to claim 1, wherein the single-crystal layer is formed through feeding of a Group III element source and a nitrogen source such that the nitrogen/Group III element ratio becomes 1,600 to 3,200.

9. A Group III nitride semiconductor multilayer structure according to claim 1, wherein the single-crystal layer is formed while the temperature of the substrate is regulated so as to fall within a range of 1,000 to 1,300° C.

10. A Group III nitride semiconductor multilayer structure according to claim 9, wherein the temperature of the substrate is regulated so as to fall within a range of 1,050 to 1,200° C.

11. A Group III nitride semiconductor light-emitting device comprising a Group III nitride semiconductor multilayer structure according to claim 1; Group III nitride semiconductor layers provided atop the single-crystal layer of the semiconductor multilayer structure, the semiconductor layers including an n-type layer, a light-emitting layer, and a p-type layer; and a negative electrode and a positive electrode which are provided at predetermined positions.

12. A Group III nitride semiconductor light-emitting device according to claim 11, wherein the n-type layer, the light-emitting layer, and the p-type layer, which constitute the Group III nitride semiconductor layers, are successively provided atop the single-crystal layer in this order; the negative electrode is provided on the n-type layer; and the positive electrode is provided on the p-type layer.

* * * * *